United States Patent
Lee et al.

(10) Patent No.: US 10,152,920 B2
(45) Date of Patent: Dec. 11, 2018

(54) CURRENT SENSING TYPE SENSING UNIT AND ORGANIC LIGHT-EMITTING DISPLAY COMPRISING THE SAME

(71) Applicant: LG Display Co., Ltd., Seoul (KR)

(72) Inventors: Chulwon Lee, Seoul (KR); Seungtae Kim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/480,121

(22) Filed: Apr. 5, 2017

(65) Prior Publication Data

US 2017/0294159 A1   Oct. 12, 2017

(30) Foreign Application Priority Data

Apr. 8, 2016 (KR) ........................ 10-2016-0043466

(51) Int. Cl.
    *G09G 3/3233*    (2016.01)
    *H01L 27/32*     (2006.01)
    *G09G 3/3291*    (2016.01)

(52) U.S. Cl.
    CPC ......... *G09G 3/3233* (2013.01); *G09G 3/3291* (2013.01); *H01L 27/3248* (2013.01); *G09G 2310/027* (2013.01); *G09G 2310/0291* (2013.01); *G09G 2320/0295* (2013.01); *G09G 2320/043* (2013.01); *G09G 2320/0646* (2013.01); *G09G 2320/0666* (2013.01); *G09G 2320/0693* (2013.01)

(58) Field of Classification Search
    CPC .............. G09G 3/3233; G09G 3/3291; G09G 2320/0693; G09G 2320/043; G09G 2320/0295; G09G 2320/0666; G09G 2320/0646; G09G 2310/0291; G09G 2310/027; H01L 27/3248
    See application file for complete search history.

(56) References Cited

U.S. PATENT DOCUMENTS

| | | | | |
|---|---|---|---|---|
| 5,841,078 A | * | 11/1998 | Miller ................... | G06F 1/1626 178/18.06 |
| 8,854,121 B2 | * | 10/2014 | Duggal ................... | G05F 3/262 323/317 |
| 2005/0007320 A1 | * | 1/2005 | Smith .................. | G09G 3/3233 345/77 |
| 2005/0007353 A1 | * | 1/2005 | Smith .................. | G09G 3/3233 345/204 |

(Continued)

FOREIGN PATENT DOCUMENTS

EP    2960894 A1    12/2015
KR    10-1280876 B1    7/2013
(Continued)

*Primary Examiner* — Jose Soto Lopez
(74) *Attorney, Agent, or Firm* — Birch, Stewart, Kolasch & Birch, LLP

(57) ABSTRACT

A current sensing unit can include a current sink circuit connected to a sensing line, which reduces a pixel current fed via the sensing line by an amount equal to a sink current; a current integrator connected to the sensing line, which accumulates an adjusted current from the sensing line and outputs an integrated value based on the pixel current minus the sink current; a sampling part that samples and holds the integrated value; and an analog-to-digital converter that converts the integrated value from an analog value to a digital sensed value.

15 Claims, 9 Drawing Sheets

(56) References Cited

U.S. PATENT DOCUMENTS

| | | | |
|---|---|---|---|
| 2006/0001613 A1* | 1/2006 | Routley | G09G 3/3216 345/76 |
| 2006/0007206 A1* | 1/2006 | Reddy | G06F 3/03542 345/204 |
| 2006/0022928 A1* | 2/2006 | Kim | G09G 3/3655 345/94 |
| 2007/0080905 A1* | 4/2007 | Takahara | G09G 3/3233 345/76 |
| 2008/0284507 A1 | 11/2008 | Pertijs et al. | |
| 2009/0213049 A1* | 8/2009 | McCreary | G09G 3/3233 345/80 |
| 2010/0097360 A1* | 4/2010 | Cho | G09G 3/325 345/205 |
| 2011/0109612 A1* | 5/2011 | Chaji | G09G 3/3283 345/211 |
| 2012/0262391 A1* | 10/2012 | Maki | G06F 3/044 345/173 |
| 2013/0016091 A1* | 1/2013 | Kato | G09G 3/3225 345/419 |
| 2013/0249853 A1* | 9/2013 | Tanaka | G06F 3/044 345/174 |
| 2014/0009512 A1* | 1/2014 | Lee | G09G 5/02 345/690 |
| 2014/0152642 A1* | 6/2014 | Kim | G09G 3/3233 345/212 |
| 2015/0070339 A1 | 3/2015 | Ahn et al. | |
| 2015/0261277 A1 | 9/2015 | Park | |
| 2015/0379909 A1* | 12/2015 | Yu | G09G 3/006 345/690 |
| 2016/0104422 A1* | 4/2016 | Kishi | G09G 3/3233 345/205 |
| 2016/0111044 A1* | 4/2016 | Kishi | G09G 3/3233 345/690 |
| 2017/0025063 A1* | 1/2017 | Chaji | G09G 3/3233 |
| 2017/0076670 A1* | 3/2017 | Chaji | G09G 3/3233 |
| 2018/0068611 A1* | 3/2018 | Chaji | G09G 3/3233 |

FOREIGN PATENT DOCUMENTS

| | | |
|---|---|---|
| KR | 10-2014-0129726 A | 11/2014 |
| KR | 10-1549343 B1 | 9/2015 |
| KR | 10-2016-0030007 A | 3/2016 |
| WO | WO 95/22117 A1 | 8/1995 |

* cited by examiner

CURRENT SENSING TYPE SENSING UNIT AND ORGANIC LIGHT-EMITTING DISPLAY COMPRISING THE SAME

This application claims the priority benefit of Korean Patent Application No. 10-2016-0043466 filed in the Republic of Korea on Apr. 8, 2016, which is hereby incorporated herein by reference for all purposes as if fully set forth herein.

BACKGROUND OF THE INVENTION

Field of the Invention

The present invention relates to a current sensing unit and an organic light-emitting display comprising the same.

Discussion of the Related Art

An active-matrix organic light-emitting display comprises self-luminous organic light-emitting diodes (hereinafter, "OLED"), and has the advantages of fast response time, high luminous efficiency, high luminance, and wide viewing angle.

An OLED, which is a self-luminous device, comprises an anode, a cathode, and organic compound layers formed between the anode and cathode. The organic compound layers comprise a hole injection layer HIL, a hole transport layer HTL, an emission layer EML, and an electron transport layer ETL, and an electron injection layer EIL. When a power supply voltage is applied to the anode and the cathode, a hole passing through the hole transport layer HTL and an electron passing through the electron transport layer ETL move to the emission layer EML, forming an exciton. As a result, the emission layer EML generates visible light.

In an organic light-emitting display, pixels each comprising an OLED and a driving TFT (thin-film transistor) are arranged in a matrix, and the brightness of an image created by the pixels is adjusted based on the grayscale of video data. The driving TFT controls a drive current flowing through the OLED based on the voltage applied between its gate electrode and source electrode. The amount of light emitted by the OLED is determined by drive current, and the brightness of an image is determined by the amount of light emitted by the OLED.

Generally, when the driving TFT operates in a saturation region, a pixel current Ip flowing between the drain and source of the driving TFT is expressed in the following Equation 1:

$$Ip = \frac{1}{2} \ast (\mu \ast C \ast W/L) \ast (Vgs - Vth)^2$$

where $\mu$ is electron mobility, C is the capacitance of a gate oxide film, W is the channel width of the driving TFT, and L is the channel length of the driving TFT. Vgs is the gate-source voltage of the driving TFT, and Vth is the threshold voltage (or critical voltage) of the driving TFT.

Electrical characteristics of the driving TFT, such as threshold voltage, electron mobility, etc., should be the same for all pixels since they serve as a factor for determining drive current Ids, as shown in Equation 1. However, the electrical characteristics of the driving TFT may vary between pixels, due to various causes including process characteristics, time-varying characteristics, etc. Pixels are different in brightness if their driving TFTs have different electrical characteristics, even if the same data voltage is applied to the pixels. It is difficult to realize a desired image unless these differences in characteristics are compensated.

There is an external compensation technology—which senses electrical characteristics of a driving TFT, corrects digital data of an input image based on the sensing result, and compensates for differences in the electrical characteristics of the driving TFT. In this technology, a current sensing unit is mounted within a source driver IC (integrated circuit) in order to sense the driving TFT's electrical characteristics, and a pixel current flowing through the driving TFT is sensed directly by the current sensing unit. The current sensing unit accumulates pixel current for a specified amount of time by an integrator connected to a sensing line and changes the pixel current to a voltage, and then obtains a digital sensed value from the voltage by using an analog-to-digital converter (hereinafter, "ADC").

The ADC is a special encoder that converts an analog signal to digital signal data, and its input voltage range, i.e., sensing range, is fixed. As the size of a display panel grows, a pixel current fed to a current integrator may increase. In this instance, an analog signal fed to the ADC may be out of the ADC's sensing range. If an analog signal fed to the ADC is out of the ADC's sensing range, the ADC's output may underflow to the lower limit of the input voltage range or overflow to the upper limit of the input voltage range, and this may lower the current sensing capability of the display device. This problem is even more apparent in large-area displays.

To improve the current sensing capability of large-area displays, increasing the size of a feedback capacitor included in the current integrator may be taken into consideration. However, there is a limit to increasing the size of the feedback capacitor due to limitations on the size of the source driver IC where the current integrator is mounted.

SUMMARY

The present invention has been made in an effort to provide an organic light-emitting display which senses electrical characteristics of a driving TFT by a current sensing method, and improves current sensing capability without increasing the size of a feedback capacitor in a current integrator.

An exemplary embodiment of the present invention provides a current sensing unit including: a current sink circuit that is connected to a sensing line and reduces a pixel current fed via the sensing line by an amount equal to a sink current; a current integrator that is connected to the sensing line and accumulates an adjusted current, which equals the pixel current minus the sink current, to produce an integrated value; a sampling part that samples and holds the integrated value; and an analog-to-digital converter that performs analog-to-digital conversion of the integrated value from the sampling part to produce a digital sensed value.

The current sensing unit of the can further include a sink current control part that controls the amount of sink current.

The current sink circuit can be implemented as a current mirror.

The current sink circuit includes: a first sink switch whose first drain electrode and first gate electrode are connected to the sink current control part, whose first source electrode is connected to a ground power source, and which allows the sink current to flow between the first drain electrode and the first source electrode; and a second sink switch whose second gate electrode is connected to the sink current control part, whose second drain electrode is connected to the sensing line, whose second source electrode is connected to the ground power source, which allows the sink current to flow between the second drain electrode and the second source electrode, and which, along with the first sink switch, constitutes the current mirror.

The sink current control part can fix the amount of sink current at a preset value.

The sink current control part can adjust the amount of sink current based on the digital sensed value.

The sink current control part includes: a control voltage source; and a control resistor connected between the control voltage source and the first drain electrode of the first sink switch.

The sink current control part can include: a control voltage source; and an operational (OP) amplifier connected to the control voltage source, in which the OP amplifier has a non-inverting input terminal connected to the control voltage source, an inverting input terminal connected to the first source electrode of the first sink switch, and an output terminal connected to the first gate electrode of the first sink switch.

Another exemplary embodiment of the present invention provides an organic light-emitting display including: a display panel with a plurality of pixels; and a current sensing unit connected to at least one of the pixels via a sensing line, in which the current sensing unit includes: a current sink circuit that is connected to a sensing line and reduces a pixel current fed via the sensing line by an amount equal to a sink current; a current integrator that is connected to the sensing line and accumulates an adjusted current, which equals the pixel current minus the sink current, to produce an integrated value; a sampling part that samples and holds the integrated value; and an analog-to-digital converter that performs analog-to-digital conversion of the integrated value from the sampling part to produce a digital sensed value.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
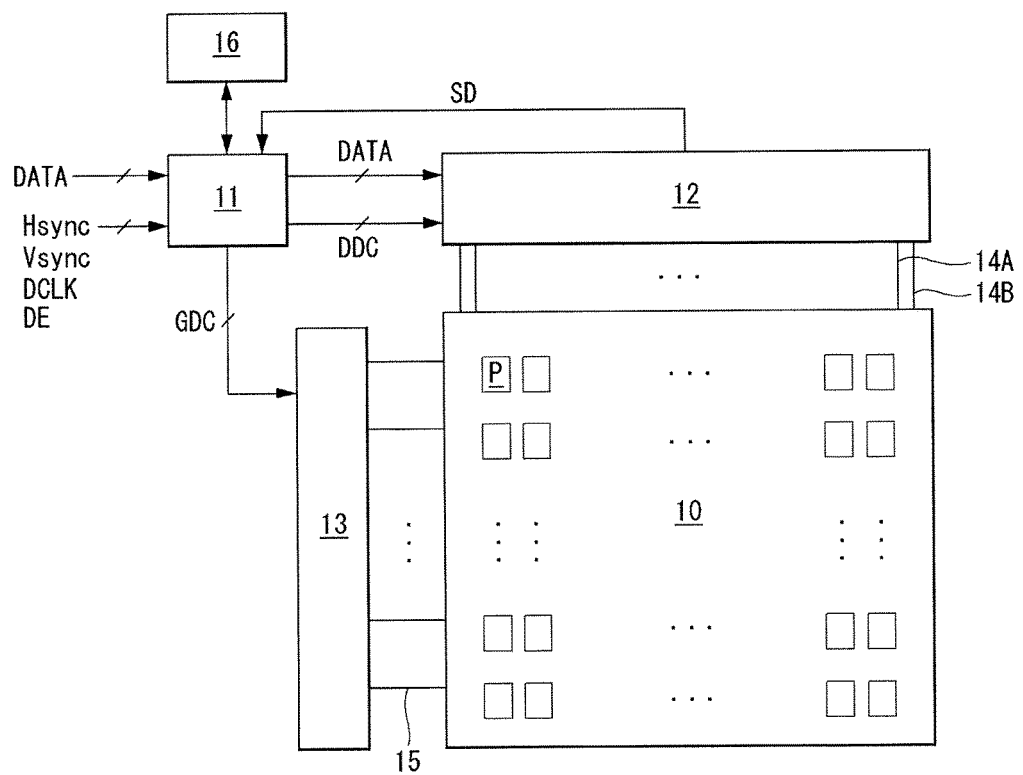
FIG. 1 shows an organic light-emitting display according to an exemplary embodiment of the present invention.

Hereinafter, exemplary embodiments of the present invention will be described in detail with reference to the attached drawings. Throughout the specification, like reference numerals denote substantially like components. In describing the present invention, a detailed description of known functions or configurations related to the present invention will be omitted when it is deemed that they may unnecessarily obscure the subject matter of the present invention.

An exemplary embodiment of the present invention will be described below with reference to FIGS. 1 to 13.

Figure 2:
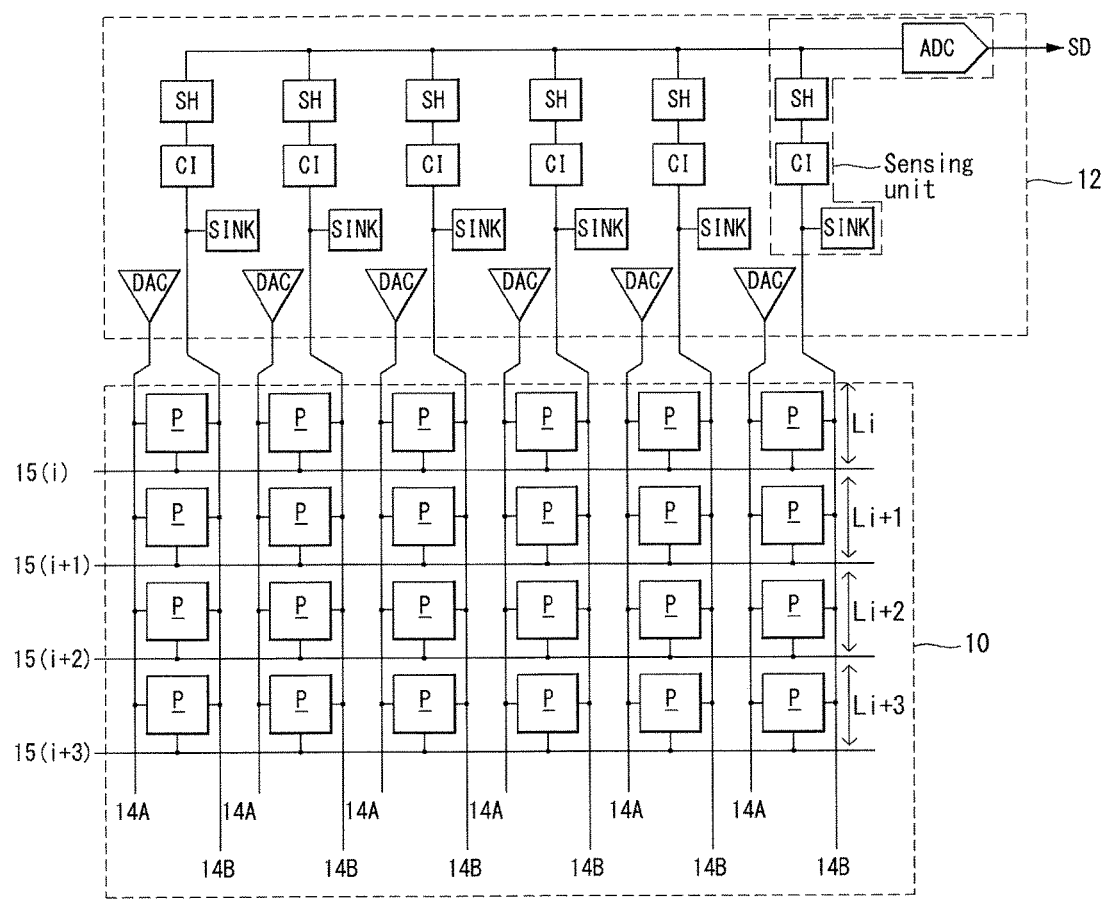
FIG. 2 shows a configuration of a pixel array and a source driver IC which are used to implement a current sensing method according to an embodiment.
Figure 3:
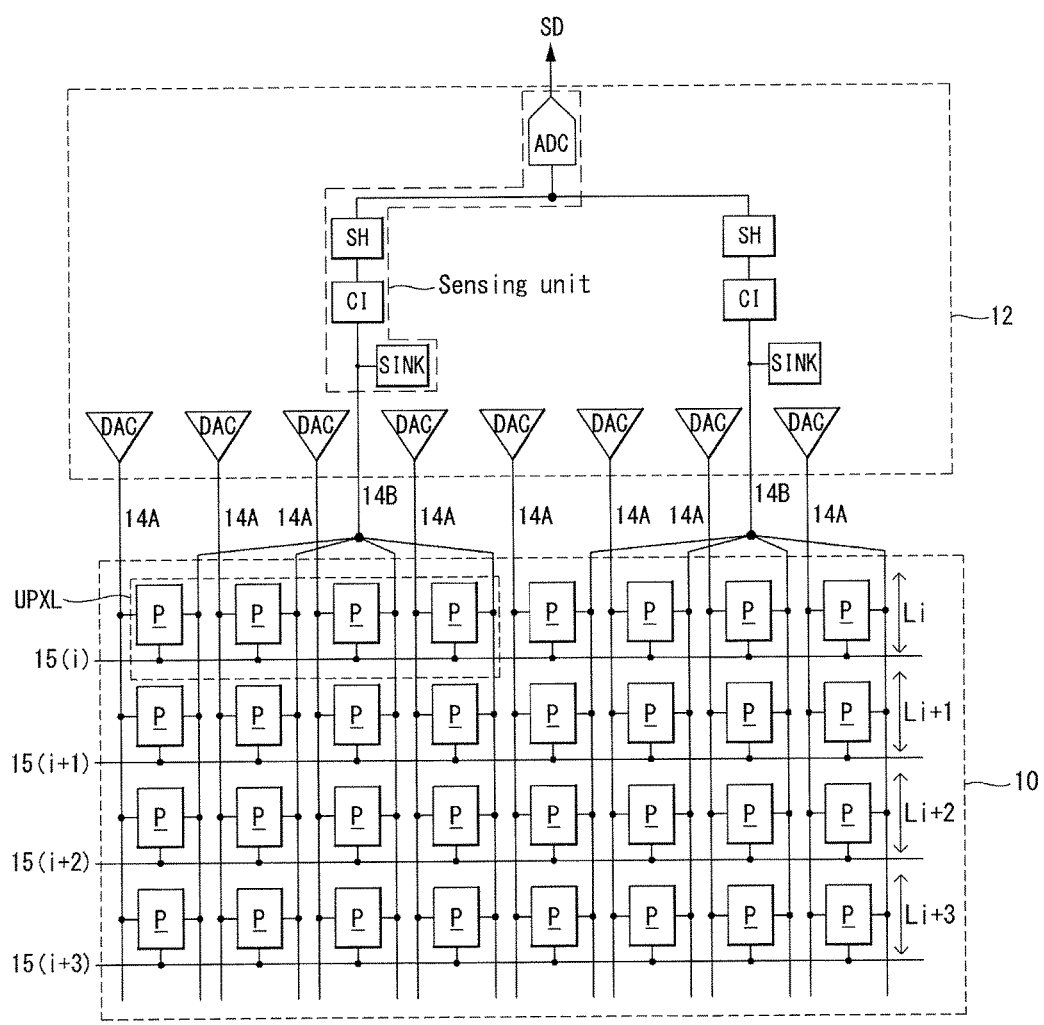
FIG. 3 shows another configuration of a pixel array and a source driver IC which are used to implement a current sensing method according to an embodiment.

FIG. 1 shows an organic light-emitting display according to an exemplary embodiment of the present invention. FIGS. 2 and 3 show examples of the configuration of a pixel array and a source driver IC which are used to implement a current sensing method according to an embodiment.

Referring to FIGS. 1 to 3, an organic light-emitting display according to an exemplary embodiment of the present invention includes a display panel 10, a timing controller 11, a data drive circuit 12, a gate drive circuit 13, and a memory 16.

A plurality of data lines 14A and sensing lines 14B and a plurality of gate lines 15 intersect each other on the display panel 10, and pixels P are arranged in a matrix at every intersection.

Each pixel P is connected to one of the data lines 14A, one of the sensing lines 14B, and one of the gate lines 15. In response to a gate pulse fed through a gate line 15, each pixel P is electrically connected to a data line 14A and at the same time a sensing line 14B.

Each pixel P receives a high-level driving voltage EVDD and a low-level driving voltage EVSS from a power generator. A pixel P of this invention may comprise an OLED, a driving TFT, first and second switching TFTs, and a storage capacitor. The TFTs of the pixel P may be implemented as p-type or n-type. A semiconductor layer of the TFTs of the pixel P can include amorphous silicon, polysilicon, or oxide.

The organic light-emitting display of this invention may employ external compensation. External compensation is a technology that senses electrical characteristics of driving TFTs in pixels P and corrects digital data DATA of an input image based on sensed values. The electrical characteristics of the driving TFTs include the threshold voltage of the driving TFTs and the electron mobility of the driving TFTs.

The timing controller 11 can temporally separate a sensing operation for sensing electrical characteristics of a driving TFT and updating corresponding compensation values and a display operation for displaying an input image reflecting the compensation values according to a prescribed control sequence. Through the control operation of the timing controller 11, the sensing operation can be performed in a vertical blanking interval during the display operation, a power-on sequence interval before the beginning of the display operation, or a power-off sequence interval after the end of the display operation. The vertical blanking interval is the time during which image data DATA is not written, which occurs between vertical active periods in which one frame of input image data DATA is written. The power-on sequence interval is the time between the turn-on of driving power and the beginning of input image display. The power-off sequence interval is the time between the end of input image display and the turn-off of driving power.

Also, the sensing operation can be performed while system power is being applied and only the screen of the display device is off—for example, standby mode, sleep mode, or low-power mode. The timing controller 11 can sense standby mode, sleep mode, or low-power mode and control overall sensing operation according to a preset sensing process.

The timing controller 11 generates data control signals DDC for controlling the operation timing of the data drive circuit 12 and gate control signals GDC for controlling the operation timing of the gate drive circuit 13, based on timing signals, such as a vertical synchronization signal Vsync, a horizontal synchronization signal Hsync, a dot clock signal DCLK, and a data enable signal DE, which are fed from a host system. The timing controller 11 can generate the control signals DDC and GDC differently for display operation and for sensing operation.

The gate control signals GDC can include a gate start pulse, a gate shift clock, etc. The gate start pulse is applied to a gate stage for generating a first output and controls the gate stage. The gate shift clock is a clock signal that is fed commonly to gate stages and shifts the gate start pulse.

The data control signals DDC include a source start pulse, a source sampling clock, a source output enable signal, etc. The source start pulse controls the timing of the start of data sampling of the data drive circuit 12. The source sampling clock is a clock signal that controls the timing of data sampling based on a rising or falling edge. The source output enable signal controls the output timing of the data drive circuit 12.

In a sensing operation, the timing controller 11 can calculate compensation parameters for compensating for changes in the electrical characteristics of the driving TFT based on digital sensed values SD fed from the data drive circuit 12, and store the compensation parameters in the memory 16. The compensation parameters stored in the memory 16 can be updated each time sensing operation is performed, and therefore time-varying characteristics of the driving TFT may be easily compensated.

In a display operation, the timing controller 11 reads the compensation parameters from the memory 16, corrects digital data DATA of an input image based on the compensation parameters, and supplies it to the data drive circuit 12.

The data drive circuit 12 includes at least one source driver IC (Integrated circuit). The source driver IC includes a plurality of digital-to-analog converters (hereinafter, DACs) connected to the data lines 14A and a plurality of sensing units 122 connected to the sensing lines 14B. Each sensing unit can be connected individually to each pixel P arranged on one pixel line (e.g., Li) via a sensing line 14B, as shown in FIG. 2, or connected commonly to a plurality of pixels P arranged on one pixel line (e.g., Li) via a sensing line 14B, as shown in FIG. 3. Although FIG. 3 illustrates that one unit pixel UPXL having four pixels P shares one sensing line 14B, the present invention is not limited to this. The present invention can be applied to various modifications in which two or more pixels P are connected to one sensing unit via one sensing line 14B.

In a display operation, the DACs of the source driver IC convert input image data DATA to a data voltage for display and supply it to the data lines 14A, in response to a data timing control signal DDC applied from the timing controller 11. The data voltage for display is a voltage that varies depending on the grayscale of the input image.

In a sensing operation, the DACs of the source driver IC generate a data voltage for sensing and supply the data voltage to the data lines 14A, in response to a data timing control signal DDC applied from the timing controller 11. The data voltage for sensing is a voltage that turns on the driving TFT of a pixel P in the sensing operation. The data voltage for sensing can have the same value for every pixel P. Also, the data voltage for sensing can have different values for different colors, with the differences in pixel characteristics between the colors taken into account. For example, the data voltage for sensing can have a first value for first pixels P that display a first color, a second value for second pixels P that display a second color, and a third value for second pixels P that display a third color.

Each sensing unit of the source driver IC can include a current sink circuit SINK, a current integrator CI, a sampling part SH, and an analog-to-digital converter (hereinafter, ADC). The current sink circuit SINK is connected to a sensing line 14B, and reduces a pixel current fed via the sensing line 14B by an amount equal to a sink current to keep the integrated value fed to the ADC within the ADC's sensing range. The amount of sink current can be fixed to a preset value corresponding to the model of the display device, or adaptively adjusted based on a digital sensed value SD output from the ADC. The current integrator CI is connected to the sensing line 14B and accumulates an adjusted current, which equals the pixel current minus the sink current, to produce an integrated value. The sampling part SH samples and holds the integrated value from the current integrator CI. The ADC performs analog-to-digital conversion of the integrated value from the sampling part SH to produce a digital sensed value SD. The digital sensed value SD is transmitted to the timing controller 11.

In a display operation, the gate drive circuit 13 generates a gate pulse for display based on a gate control signal GDC and then sequentially supplies the gate pulse to gate lines 15 connected to pixel lines LI, Li+1, Li+2, Li+3, .... Each of the pixel lines LI, Li+1, Li+2, Li+3, ... is a set of horizontally neighboring pixels P.

In a sensing operation, the gate drive circuit 13 generates a gate pulse for sensing based on a gate control signal GDC and then sequentially supplies the gate pulse to the gate lines 15 connected to the pixel lines LI, Li+1, Li+2, Li+3, .... The pixel lines LI, Li+1, Li+2, Li+3, ... are a set of horizontally neighboring pixels P. The gate pulse for sensing can have a wider on-pulse period than the gate pulse for display. As for the gate pulse for sensing, one or more on-pulse periods can be included within 1 line sensing ON time. Here, the 1 line sensing ON time refers to the scanning time spent on simultaneously sensing the pixels P of one pixel line (e.g., Li).

Figure 4:
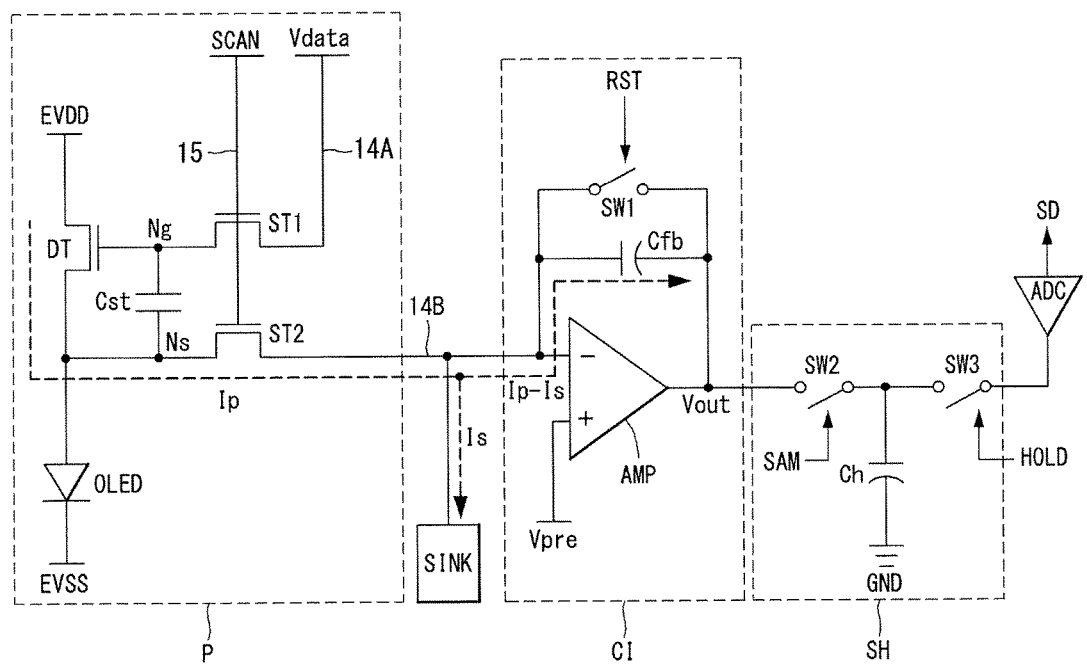
FIGS. 4 and 5 are views illustrating a connection structure and sensing operation of a pixel and a sensing unit which are used to implement a current sensing method according to an embodiment.
Figure 5:
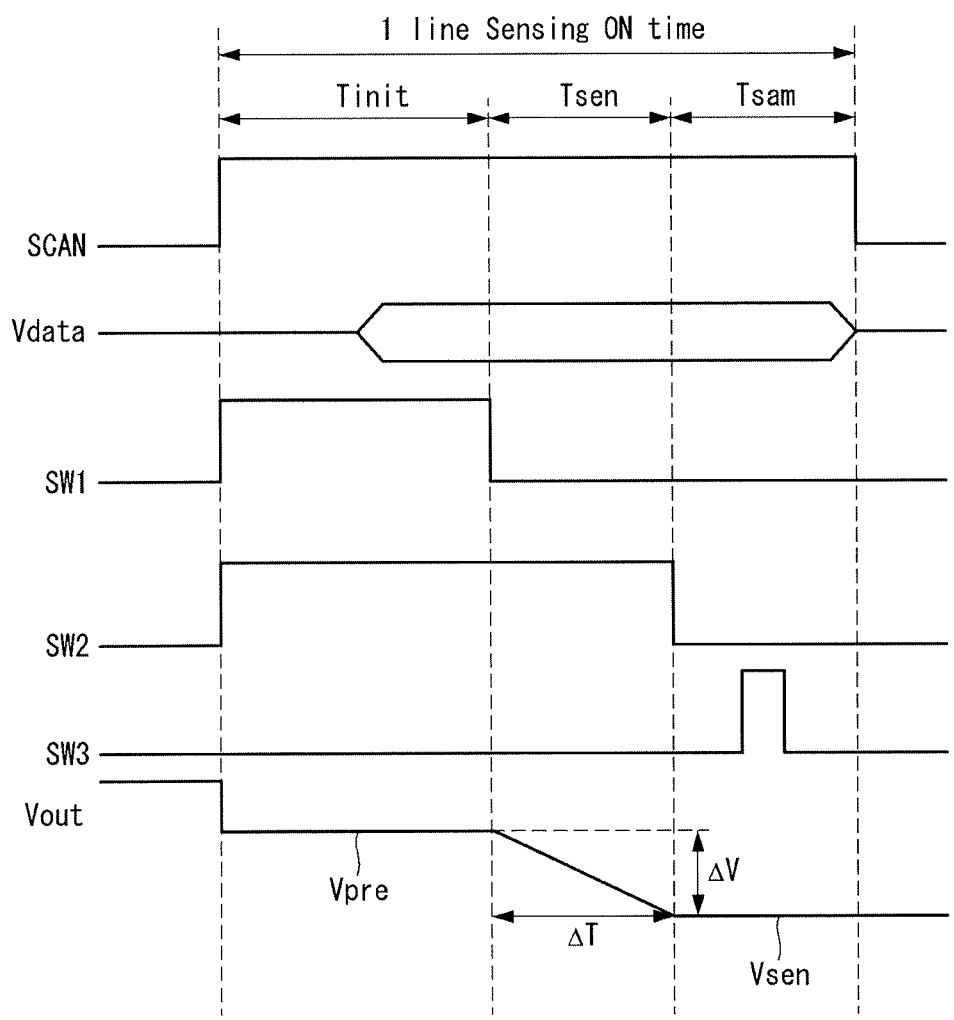

FIGS. 4 and 5 are views illustrating a connection structure and sensing operation of a pixel and a sensing unit which are used to implement a current sensing method. FIGS. 4 and 5 are merely an example for helping understand how current sensing works. Since a pixel structure to which current sensing of this invention is applied and its operation timing can be modified in various ways, thus the present invention is not limited to this example.

Referring to FIG. 4, a pixel P of this invention can comprise an OLED, a driving TFT DT, a storage capacitor Cst, a first switching TFT ST1, and a second switching TFT ST2.

The OLED has an anode connected to a source node Ns, a cathode connected to an input terminal of low-level driving voltage EVSS, and organic compound layers located between the anode and the cathode. The driving TFT DT controls the amount of electric current fed to the OLED based on a gate-source voltage Vgs. The driving TFT DT has a gate electrode connected to a gate node Ng, a drain electrode connected to an input terminal of high-level driving voltage EVDD, and a source electrode connected to the source node Ns. The storage capacitor Cst is connected between the gate node Ng and the source node Ns. The first switching TFT ST1 applies a data voltage Vdata on a data line 14A to the gate node Ng in response to a gate pulse SCAN. The first switching TFT ST1 has a gate electrode connected to a gate line 15, a drain electrode connected to the data line 14A, and a source electrode connected to the gate node Ng. The second switching TFT ST2 turns on/off the current flow between the source node Ns and a sensing line 14B in response to a gate pulse SCAN. The second switching TFT ST2 has a gate electrode connected to a second gate line 15B, a drain electrode connected to the sensing line 14B, and a source electrode connected to the source node Ns.

A current sink circuit SINK and a current integrator CI, which form part of a sensing unit, are connected in parallel to the sensing line 14B. The current sink circuit SINK reduces a pixel current Ip fed to the current integrator CI by an amount equal to a sink current Is. The current sink circuit SINK will be described in detail with reference to FIGS. 6 to 9.

The current integrator CI comprises an OP amplifier AMP, a feedback capacitor Cfb, and a first switch SW1, and accumulates an adjusted current Ip−Is, which equals the pixel current Ip minus the sink current Is, to produce an integrated value Vsen. The OP amplifier AMP has an inverting input terminal (−) that is connected to the sensing line 14B and receives the adjusted current Ip−Is, a non-inverting input terminal (+) that receives a reference voltage Vpre, and an output terminal that outputs the integrated value Vsen. The feedback capacitor Cfb is connected between the inverting input terminal (−) and output terminal of the OP amplifier AMP and accumulates the adjusted current Ip−Is. The first switch SW1 is connected to both ends of the feedback capacitor Cfb. The feedback capacitor Cfb is reset when the first switch SW1 turns on.

A sampling part SH, which forms another part of the sensing unit, can include a second switch SW2 that is switched on in response to a sampling signal SAM, a third switch SW3 that is switched on in response to a holding signal HOLD, and a holding capacitor Ch, one end of the holding capacitor Ch is connected between the third and second switches SW2 and SW3, and the other end is connected to a ground voltage source GND. The sampling part SH samples and holds the integrated value Vsen from the current integrator CI.

An ADC, which is also part of the sensing unit, is connected to the holding capacitor Ch via the third switch SW3.

FIG. 5 illustrates the waveforms of one sensing operation for each pixel, within an on-pulse period (i.e., 1 line sensing ON time) of a gate pulse SCAN for sensing pixels arranged on one pixel line. Referring to FIG. 5, a sensing operation includes a reset period Tinit, a sensing period Tsen, and a sampling period Tsam.

In the reset period Tinit, the amplifier AMP operates as a unit gain buffer with a gain of 1 when the first switch SW1 is turned on. In the reset period Tinit, the input terminals (+,−) and output terminal of the amplifier AMP, the sensing line 14B, and the source node Ns are all reset to the reference voltage Vpre.

In the reset period Tinit, a data voltage for sensing is applied to the gate node Ng of the pixel P through the DAC of the source driver IC. Thus, a pixel current Ip equivalent to the potential difference Vdata−Vpre between the gate node Ng and the source node Ns flows through the driving TFT DT. The amplifier AMP continues to operate as the unit gain buffer during the reset period Tinit, so the output Vout of the current integrator CI is maintained at the reference voltage Vpre.

During the sensing period Tsen, the amplifier AMP operates as the current integrator CI when the first switch SW1 is turned off and integrates the pixel current Ip flowing through the driving TFT DT. In this instance, the current integrator CI accumulates an adjusted current Ip−Is, which equals the pixel current minus the sink current Is, and therefore exhibits a stable current sensing capability even if the pixel current Ip is high. Due to the adjusted current Ip−Is fed to the inverting input terminal (−) of the amplifier AMP during the sensing period Tsen, the longer the sensing time ΔT, i.e., the greater the amount of accumulated current, the larger the potential difference between both ends of the feedback capacitor Cfb. However, due to the characteristics of the amplifier AMP, the inverting input terminal (−) and non-inverting input terminal (+) are shorted through a virtual ground, leaving a potential difference of zero between them. Thus, the potential at the inverting input terminal (−) is maintained at the reference voltage Vpre during the sensing period Tsen, regardless of an increase in the potential difference across the feedback capacitor Cfb. Instead, the potential at the output terminal of the amplifier AMP is reduced corresponding to the potential difference between both ends of the feedback capacitor Cfb. Based on this principle, during the sensing period Tsen, the output Vout of the current integrator CI changes to an integrated value Vsen, which is a voltage, through the feedback capacitor Cfb. As the amount of adjusted current Ip−Is fed via the sensing line 14B increases, the slope of the output Vout of the current integrator CI falls more quickly. Thus, the voltage difference ΔV between the reference voltage Vpre and the integrated value CI increases. During the sensing period Tsen, the integrated value Vsen is stored in the holding capacitor Ch via the second switch SW2.

During the sampling period Tsam, when the third switch S3 turns on, the integrated value Vsen stored in the holding capacitor Ch is fed to the ADC via the third switch SW3. The integrated value Vsen is converted into a digital sensed value SD in the ADC and then transmitted to the timing controller 11. The digital sensed value SD is used by the timing controller 11 to derive threshold voltage variation ΔVth and mobility variation ΔK for the driving TFTs. The timing controller 11 pre-stores the capacitance of the feedback capacitor Cfb, the reference voltage Vrep, and the sensing time value ΔT in digital code. Accordingly, the timing controller 11 can calculate the source-drain current Ids=Cfb*ΔV/Δt (where ΔV=Vpre-Vsen) flowing through the driving TFT DT, based on the digital sensed value SD, which is a digital code for the integrated value Vsen. The timing controller 11 applies the digital sensed value SD to a compensation algorithm to derive variations (ΔVth and ΔK) and compensation data for compensating for the variations. The compensation algorithm can be implemented as a look-up table or a calculational logic.

Figure 6:
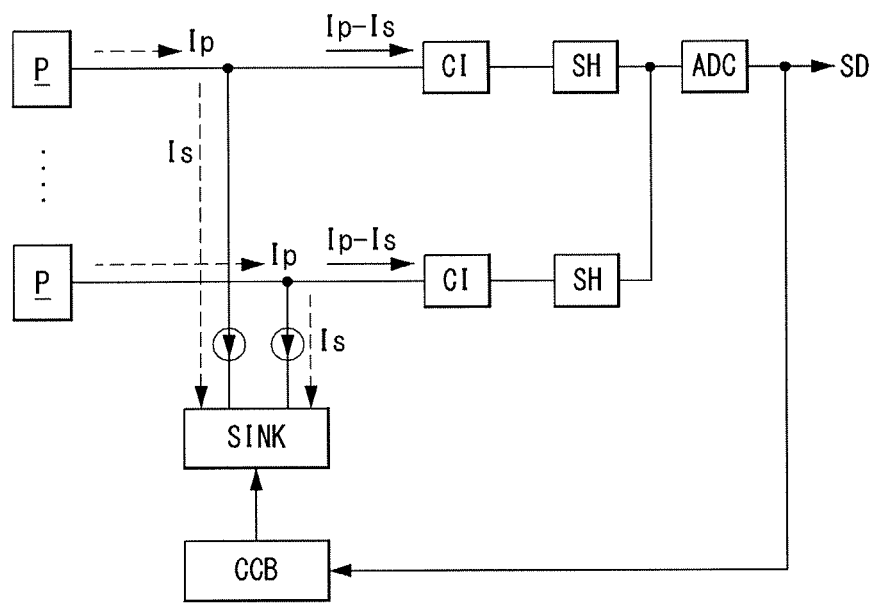
FIGS. 6 and 7 are views showing one configuration for improving current sensing capability in a large-area organic light-emitting display according to an embodiment.
Figure 7:
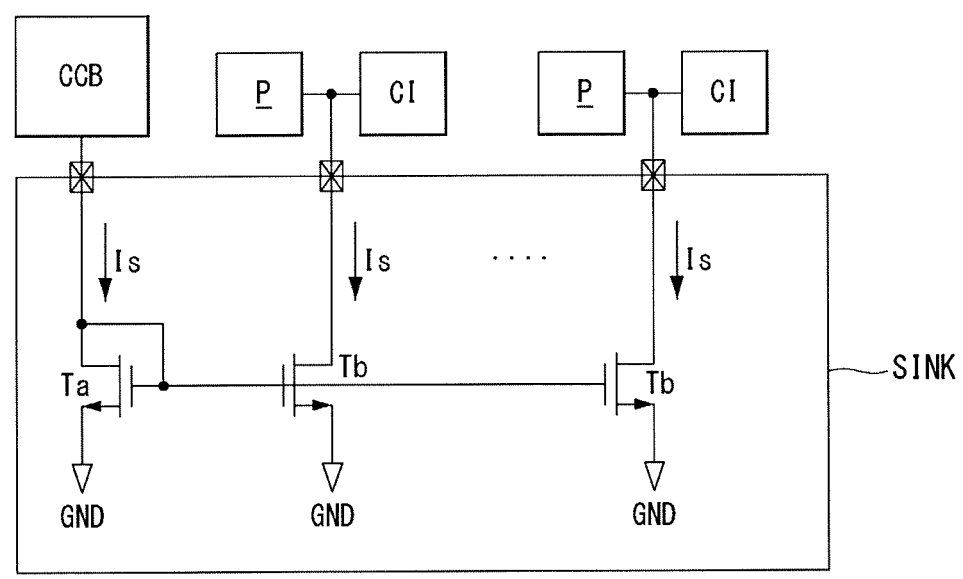

FIGS. 6 and 7 are views showing one configuration for improving current sensing capability in a large-area organic light-emitting display according to an embodiment.

Referring to FIGS. 6 and 7, in order to improve current sensing capability without increasing the size of the feedback capacitor Cfb in the current integrator CI, the sensing unit has a current sink circuit SINK that reduces a pixel current Ip fed via the sensing line 14B by an amount equal to a sink current. The sensing unit of this invention can further include a sink current control part CCB that controls the amount of sink current Is.

The current sink circuit SINK can be implemented as a current mirror. The current sink circuit SINK has a first sink switch Ta and a plurality of second sink switches Tb which, along with the first sink switch Ta, constitute the current mirror.

The first sink switch Ta includes a drain electrode and gate electrode connected to the sink current control part CCB, and a source electrode connected to a ground voltage source GND. A sink current Is supplied from the sink current control part CCB flows between the drain and source. Each second sink switch Tb includes a gate electrode connected to the sink current control part CCB, a drain electrode connected to a sensing line 14B, and a source electrode connected to the ground voltage source GND. A sink current Is supplied from the sink current control part CCB flows between the drain and source.

The sink current control part CCB can fix the amount of sink current Is to a preset value. In this instance, the amount of sink current Is can vary depending on the model, specification, etc. of the display device.

Figure 10:
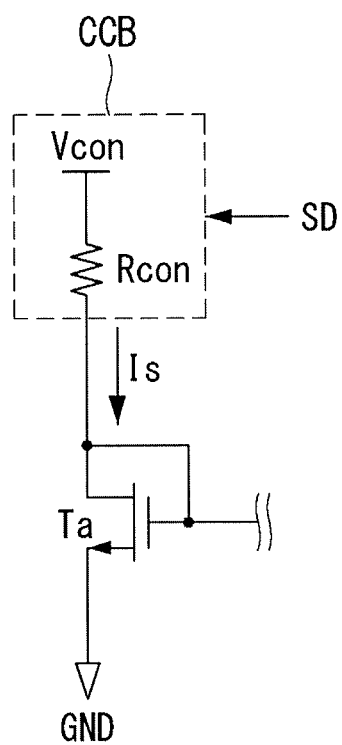
FIG. 10 is a view showing one configuration of a sink current control part according to an embodiment.

As shown in FIG. 10, the sink current control part CCB can include a control voltage source Vcon and a control resistor Rcon connected between the control voltage source Vcon and the drain electrode of the first sink switch Ta.

Figure 11:
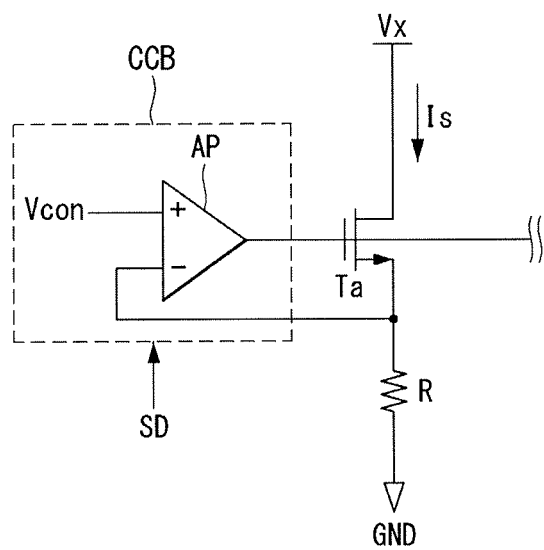
FIG. 11 is a view showing another configuration of the sink current control part according to an embodiment.

As shown in FIG. 11, the sink current control part CCB can include an OP amplifier AP having a non-inverting input terminal (+) connected to the control voltage source Vcon, an inverting input terminal (−) connected to the source electrode of the first sink switch Ta, and an output terminal connected to the gate electrode of the first sink switch Ta. In FIG. 11, Vx is a high-level power source connected to the first sink switch Ta, and R is a load resistor connected to the first sink switch Ta.

In addition, the sink current control part CCB can adjust the amount of sink current Is based on a digital sensed value SD output from the ADC. If the frequency that the digital sensed value SD is saturated to an upper or lower limit of the ADC sensing range exceeds a set reference value, the sink current control part CCB can control the amount of sink current Is by adjusting at least one of the control voltage source Vcon and control resistor Rcon of FIGS. 10 and 11.

Figure 8:
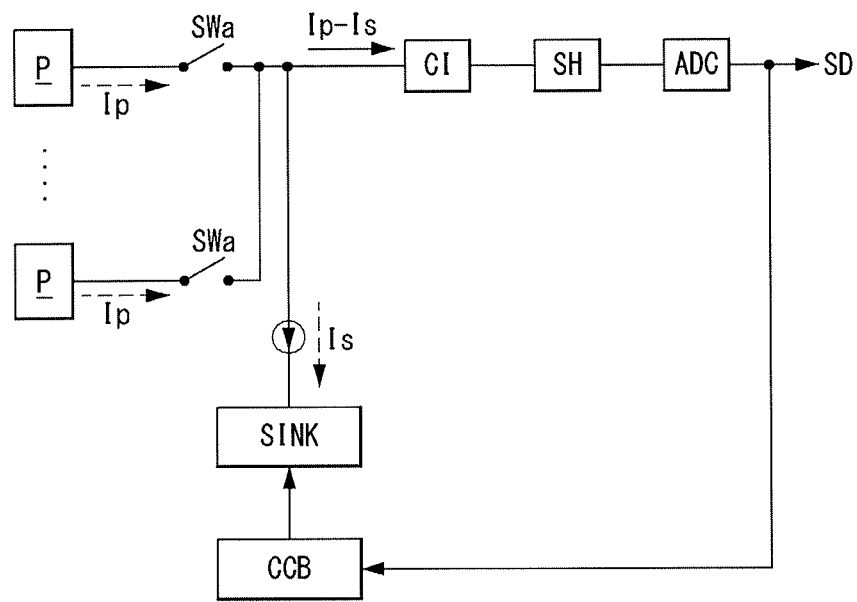
FIGS. 8 and 9 are views showing another configuration for improving current sensing capability in a large-area organic light-emitting display according to an embodiment.
Figure 9:
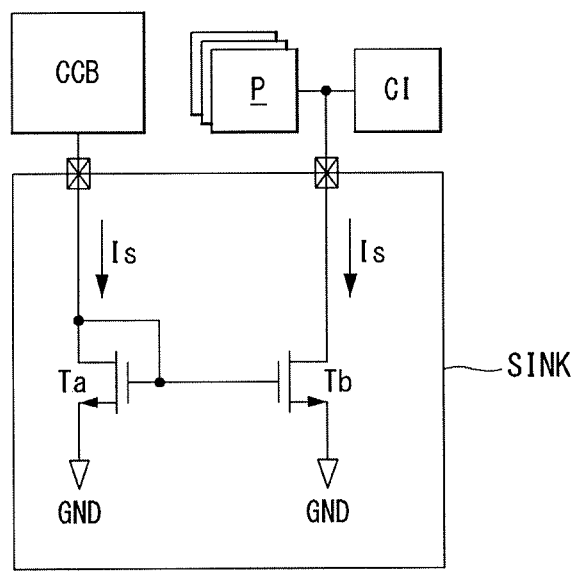

FIGS. 8 and 9 are views showing another configuration for improving current sensing capability in a large-area organic light-emitting display according to an embodiment.

Unlike the organic light-emitting display of FIGS. 6 and 7, in which a current integrator CI is individually connected to each pixel P arranged on one pixel line via a sensing line 14B, a current integrator C1 in an organic light emitting display of FIGS. 8 and 9 is commonly connected to a plurality of pixels P arranged on one pixel line via a sensing line 14B.

Referring to FIGS. 8 and 9, in order to improve current sensing capability without increasing the size of the feedback capacitor Cfb in the current integrator CI, the sensing unit has a current sink circuit SINK that reduces a pixel current Ip fed via the sensing line 14B by an amount equal to a sink current. The sensing unit can further include a sink current control part CCB that controls the amount of sink current Is.

The current sink circuit SINK can be implemented as a current mirror. The current sink circuit SINK has a first sink switch Ta and a second sink switch Tb which, along with the first sink switch Ta, constitute the current mirror.

The first sink switch Ta includes a drain electrode and gate electrode connected to the sink current control part CCB and a source electrode connected to a ground voltage source GND. A sink current Is supplied from the sink current control part CCB flows between the drain and source. The second sink switch Tb includes a gate electrode connected to the sink current control part CCB, a drain electrode connected to a sensing line 14B, and a source electrode connected to the ground voltage source GND. A sink current Is supplied from the sink current control part CCB flows between the drain and source.

The sink current control part CCB can fix the amount of sink current Is to a preset value. In this instance, the amount of sink current Is can vary depending on the model, specification, etc. of the display device.

As shown in FIG. 10, the sink current control part CCB can include a control voltage source Vcon and a control resistor Rcon connected between the control voltage source Vcon and the drain electrode of the first sink switch TA.

As shown in FIG. 11, the sink current control part CCB can include an OP amplifier AP having a non-inverting input terminal (+) connected to the control voltage source Vcon, an inverting input terminal (−) connected to the source electrode of the first sink switch Ta, and an output terminal connected to the gate electrode of the first sink switch Ta. In FIG. 11, Vx is a high-level power source connected to the first sink switch Ta, and R is a load resistor connected to the first sink switch Ta.

In addition, the sink current control part CCB can adjust the amount of sink current Is based on a digital sensed value SD output from the ADC. If the frequency that the digital sensed value SD is saturated to an upper or lower limit of the ADC sensing range exceeds a set reference value, the sink current control part CCB can control the amount of sink current Is by adjusting at least one between the control voltage source Vcon and control resistor Rcon of FIGS. 10 and 11.

Figure 12:
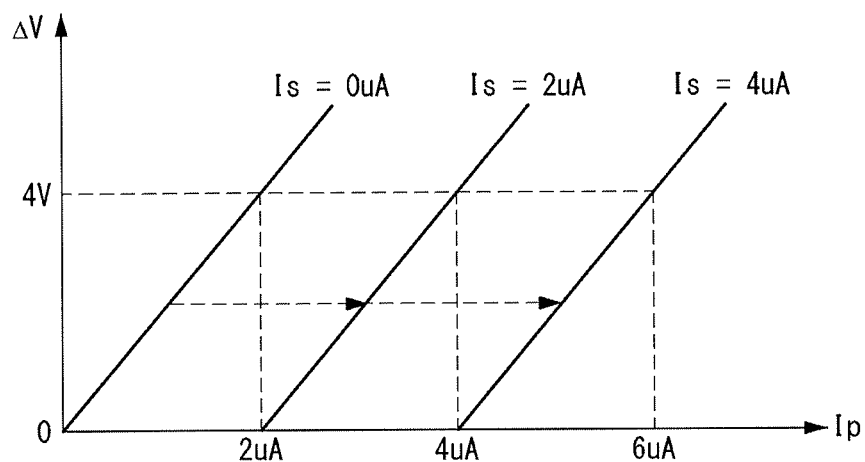
FIG. 12 shows an example of varying or adjusting the amount of sink current Is depending on the amount of pixel current Ip according to an embodiment.

FIG. 12 shows an example of varying or adjusting the amount of sink current Is depending on the amount of pixel current Ip.

Referring to FIG. 12, the amount of sink current Is increases as the amount of pixel current Ip increases. That is, if the pixel current Ip is 2 uA, the sink current Is is set (or adjusted) to 0 uA, if the pixel current Ip is 4 uA, the sink current Is is set (or adjusted) to 2 uA, and if the pixel current Ip is 6 uA, the sink current Is is set (or adjusted) to 4 uA. In this way, an adjusted current Ip−Is fed to the integrator becomes equal to 2 uA. In the present invention, the adjusted current Ip−Is fed to the integrator can be fixed at a certain value, regardless of the amount of pixel current Ip. Thus, the potential difference at the output terminal of the integrator—that is, the voltage difference ΔV between the reference voltage Vpre and the integrated value Vsen—can be kept at 4 V. If the voltage difference ΔV is too small or large (that is, the integrated value Vsen is too high or low), the integrated value Vsen fed to the ADC may fall outside of the ADC's sensing range. The present invention can solve this problem by controlling the integrated value Vsen through the use of sink current and the sensing unit.

Through this process, the present invention can easily achieve optimal sensing capability without increasing the size of the feedback capacitor Cfb in the integrator when the pixel current Ip is large.

Figure 13:
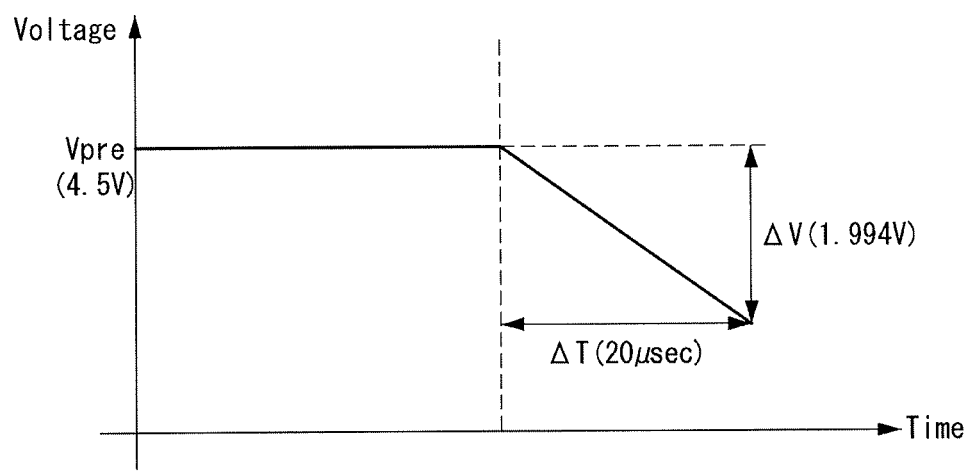
FIG. 13 is a view of the results of a simulation showing that the current sensing capability of a large-area display can be achieved.

FIG. 13 illustrates the results of a simulation showing that the current sensing capability of a large-area display can be achieved.

In Table 1, the simulation was performed under the conditions that the capacitance of the feedback capacitor is 6 pF, the sensing time ΔT is 20 usec, and the reference voltage Vpre is 4.6 V.

Case 1 indicates the output ΔV of the current integrator when the pixel current Ip is 600 nA and the sink current Is is set to 0 A. Case 2 indicates the output ΔV of the current integrator when the pixel current Ip is 2.1 uA and the sink current Is is set to 1.5 uA.

TABLE 1

| S/H signal level | Case 1 (Ip = 600 nA, Is = 0 A) | Case 2 (Ip = 2.1 uA, Is = 1.5 uA) |
|---|---|---|
| ΔV [V] | 1.994 | 1.994 |

The pixel current Ip in Case 1 is larger than that in Case 2. In Case 2, however, the amount of adjusted current Ip−Is fed to the current integrator can be made equal to that in Case 1 by increasing the sink current Is compared to Case 1. Accordingly, the output ΔV of the current integrator is made equal for Cases 1 and 2. This shows that, even with models whose pixel current Ip exceeds the ADC's current sensing range, the sensing unit is capable of accurate sensing through the use of a current sink method. In the present invention, the current sensing capability of large-area displays such as 77-inch and 100-inch displays can be improved significantly through the use of a current sink method of the sensing unit.

As described above, in the present invention, a current fed to an integrator can be fixed at a certain value, regardless of the amount of pixel current, by reducing the pixel current by an amount equal to a sink current. Therefore, the present invention can easily achieve optimal sensing capability without increasing the size of the feedback capacitor in the integrator when the pixel current is large.

Throughout the description, it should be understood by those skilled in the art that various changes and modifications are possible without departing from the technical principles of the present invention. Therefore, the technical scope of the present invention is not limited to the detailed descriptions in this specification but should be defined by the scope of the appended claims.

What is claimed is:

1. A current sensing unit comprising:
a current sink circuit connected to a sensing line and configured to reduce a pixel current fed via the sensing line by an amount equal to a sink current;
a sink current control part configured to adjust an amount of the sink current;
a current integrator connected to the sensing line and configured to accumulate an adjusted current from the sensing line and output an integrated value based on the pixel current minus the sink current;
a sampling part configured to sample and hold the integrated value; and
an analog-to-digital converter configured to convert the integrated value from an analog value to a digital sensed value,
wherein the sink current control part adjusts the amount of sink current based on the digital sensed value.

2. The current sensing unit of claim 1, wherein the current sink circuit is a current mirror.

3. The current sensing unit of claim 2, wherein the current mirror comprises:
a first sink switch including a first drain electrode and a first gate electrode connected to the sink current control part, and a first source electrode connected to a ground power source,
wherein the first sink switch is configured to allow the sink current to flow between the first drain electrode and the first source electrode; and
a second sink switch including a second gate electrode connected to the sink current control part, a second drain electrode connected to the sensing line, and a second source electrode connected to the ground power source, wherein the second switch is configured to allow the sink current to flow between the second drain electrode and the second source electrode.

4. The current sensing unit of claim 1, wherein the sink current control part fixes the amount of sink current at a preset value.

5. The current sensing unit of claim 3, wherein the sink current control part comprises:
a control voltage source; and
a control resistor connected between the control voltage source and the first drain electrode of the first sink switch.

6. The current sensing unit of claim 3, wherein the sink current control part comprises:
a control voltage source; and
an operational (OP) amplifier connected to the control voltage source, wherein the OP amplifier has a non-inverting input terminal connected to the control voltage source, an inverting input terminal connected to the first source electrode of the first sink switch, and an output terminal connected to the first gate electrode of the first sink switch.

7. An organic light-emitting display comprising:
a display panel including a plurality of pixels; and
a current sensing unit connected to at least one of the plurality of pixels via a sensing line,
wherein the current sensing unit comprises:
a current sink circuit connected to a sensing line and configured to reduce a pixel current fed via the sensing line by an amount equal to a sink current;
a sink current control part configured to adjust an amount of the sink current;
a current integrator connected to the sensing line and configured to accumulate an adjusted current from the sensing line and output an integrated value based on the pixel current minus the sink current;
a sampling part configured to sample and hold the integrated value; and
an analog-to-digital converter configured to convert the integrated value from an analog value to a digital sensed value;
wherein the sink current control part adjusts the amount of sink current based on the digital sensed value.

8. The organic light-emitting display of claim 7, wherein the current sink circuit is a current mirror.

9. The organic light-emitting display of claim 8, wherein the current mirror comprises:
a first sink switch including a first drain electrode and a first gate electrode connected to the sink current control part, and a first source electrode connected to a ground power source,
wherein the first sink switch is configured to allow the sink current to flow between the first drain electrode and the first source electrode; and a second sink switch including a second gate electrode connected to the sink current control part, ae second drain electrode connected to the sensing line, and a second source electrode connected to the ground power source, wherein the second switch is configured to allow the sink current to flow between the second drain electrode and the second source electrode.

10. The organic light-emitting display of claim 7, wherein the sink current control part fixes the amount of sink current at a preset value.

11. The organic light-emitting display of claim 9, wherein the sink current control part comprises:
   a control voltage source; and
   a control resistor connected between the control voltage source and the first drain electrode of the first sink switch.

12. The organic light-emitting display of claim 9, wherein the sink current control part comprises:
   a control voltage source; and
   an operational (OP) amplifier connected to the control voltage source, wherein the OP amplifier has a non-inverting input terminal connected to the control voltage source, an inverting input terminal connected to the first source electrode of the first sink switch, and an output terminal connected to the first gate electrode of the first sink switch.

13. The organic light-emitting display of claim 7, wherein each pixel, in a group of pixels arranged on one pixel line among the plurality of pixel, is individually connected to a corresponding current integrator connected to a corresponding sensing line.

14. The organic light-emitting display of claim 7, wherein the current integrator is commonly connected to a group pixels arranged on one pixel line among the plurality of pixels via the sensing line.

15. The organic light-emitting display of claim 7, wherein the adjusted current is input to the current integrator and the analog-to-digital converter outputs the digital sensed value during a vertical blanking interval between active periods of a display operation that writes input image data to the plurality of pixels, a power-on sequence interval before the beginning of the display operation, or a power-off sequence interval after an end of the display operation.

* * * * *